United States Patent
Xu et al.

[19]

[11] Patent Number: 6,064,290
[45] Date of Patent: May 16, 2000

[54] SHORT BORE-LENGTH ASYMMETRIC ELECTROMAGNETS FOR MAGNETIC RESONANCE IMAGING

[75] Inventors: Hao Xu, Sunnyvale; Steven Conolly, Palo Alto; Bob S. Hu, Stanford, all of Calif.

[73] Assignee: The Board of Trustees of the Leland Stanford Junior University, Palo Alto, Calif.

[21] Appl. No.: 09/316,530

[22] Filed: May 21, 1999

[51] Int. Cl.$^7$ .................................................... G01V 3/00
[52] U.S. Cl. ...................... 335/296; 335/299; 335/301; 324/319; 324/320; 600/422
[58] Field of Search .................... 335/216, 296, 335/299, 301; 324/318, 319, 320, 300; 600/410, 421, 422, 407, 300

[56] References Cited

U.S. PATENT DOCUMENTS

| | | | |
|---|---|---|---|
| 5,382,904 | 1/1995 | Pissanetzky | 324/319 |
| 5,396,207 | 3/1995 | Dorri et al. | 335/216 |
| 5,416,415 | 5/1995 | Dorri et al. | 324/318 |
| 5,801,609 | 9/1998 | Laskaris et al. | 335/216 |

*Primary Examiner*—Lincoln Donovan
*Assistant Examiner*—Raymond Barrera
*Attorney, Agent, or Firm*—Lumen Intellectual Property Services

[57] ABSTRACT

A homogeneous field electromagnet having at least two coils in each of two regions. One region has a smaller inner radius than the other region so that the magnet is asymmetrical. The magnet has coils with a smaller radius on one side compared to the other side. This provides the benefit of allowing the magnet to be shorter for a given field of view size (compared to a uniform-radius cylindrical magnet). In a preferred embodiment the magnet is short enough so that a patient's heart can be located within the field of view (FOV) while visual access is provided to the patient's face. Specific dimensions are given for the two regions, including lengths, inner radii, and outer radii. The magnet can also include gradient coils and RF electronics for magnetic resonance imaging.

23 Claims, 4 Drawing Sheets

SHORT BORE-LENGTH ASYMMETRIC ELECTROMAGNETS FOR MAGNETIC RESONANCE IMAGING

STATEMENT REGARDING FEDERALLY SPONSORED RESEARCH OR DEVELOPMENT

This invention was made with Government support under contract HL-61864 awarded by the National Institutes of Health. The government has certain rights in the invention.

FIELD OF THE INVENTION

This invention relates generally to magnetic resonance imaging. More particularly, it relates to short length homogeneous field magnet designs for magnetic resonance imaging.

BACKGROUND OF THE INVENTION

Magnetic resonance imaging (MRI) is a common and well-known technique for imaging the internal structure of objects and for medical diagnosis. MRI requires that the object to be imaged be placed in a uniform (typically to within 1–10 ppm) and strong (typically in the range of 0.5 to 1.5 Tesla) magnetic field. Generating such magnetic fields is difficult and expensive.

A concern in designing MRI devices for medical imaging is open access to the patient. Some patients are claustrophobic and are very uncomfortable in a magnet bore. Also, some medical procedures are best performed with visual access to the patient or patients face. For example, visual contact with the patient is particularly important during a cardiac stress MRI study where the heart is imaged while being stressed. Without visual contact during the stress study, the procedure would need to be interrupted every time the patient feels discomfort to assess the gravity of the complaint. Even more serious is the possibility of missing an indication of patient deterioration, which could lead to grave consequences for the patient.

Typically, MRI homogeneous magnets for full-body imaging have a magnet length of about 150 cm, with the field of view (FOV) located in the center of the magnet. For cardiac imaging, the patient must be placed in the magnet so that the patient's heart is centered in the FOV. For all but perhaps the tallest patients, the patient's face cannot be seen from outside the magnet. Also, for imaging body parts other than the lower extremities, visual access to the patient's face is cut off.

MRI equipment manufacturers have attempted to make magnets as short as possible so patients within the magnet are not so inaccessible and uncomfortable. The relation between magnet cost and magnet length is generally not well understood in the art.

It would be an advance in the art to provide short MRI magnets that provide a relatively large FOV at reduced cost. Particularly, it would be an advance to provide magnets short enough for cardiac imaging while allowing visual access to the patient's face.

OBJECTS AND ADVANTAGES OF THE INVENTION

Accordingly, it is a primary object of the present invention to provide a homogeneous field magnet for MRI that:

1) is short enough to provide a FOV at a patients heart while allowing the patients face to be outside the magnet;

2) is short compared to prior art magnets and relatively inexpensive compared to conventional magnet designs of the same length;

3) can provide cardiac MRI while allowing visual access to the patients face.

These and other objects and advantages will be apparent upon reading the following description and accompanying drawings.

SUMMARY OF THE INVENTION

These objects and advantages are attained by an electromagnet having a first region and a second region. At least two coils are contained within the first region and two coils are contained within the second region. The first and second regions are hollow, coaxial cylinders. The first region has an inner radius R1a in the range of 45–60 centimeters, an outer radius R1b in the range of 60–80 centimeters, and a length L1 in the range of 40–100 centimeters. The second region has an inner radius R2a in the range of 22.5–42 centimeters, an outer radius R2b in the range of 45–60 centimeters, and a length L2 in the range of 20–40 centimeters. The first region and the second region abut at a midplane. There are no coils outside the first region and the second region which reinforce a magnetic field from coils located within the first region and second region. In other words, any coil located outside the first and second regions must be a shielding coil. The coils are designed to provide a homogeneous magnetic field within a field of view. Preferably, the field of view is located 20–50 cm from the narrow end of the magnet.

The present invention may include further preferred limits on the dimensions of the first region and second region. Preferably, all the coils in the first region and the second region conduct current in the same direction. A single coil in the second region may conduct current in a reverse direction. Also, a single coil in the first region may conduct current in a reverse direction. The magnet may further include a gradient coil aligned with the first region.

Preferably, a total length of the magnet is in the range of 90–115 cm (not including the cryostat).

The magnet may include a shielding coil or pair of shielding coils located outside the first and second regions. The shielding coil necessarily carries current in a direction to oppose the magnetic field in the field of view.

The first region or second region may include a third coil.

DETAILED DESCRIPTION

The present inventors have discovered a fundamental scaling law for cylindrical electromagnets. The scaling law relates the field of view (FOV) size of a magnet and its axial length with the cost of the magnet in terms of its power consumption (relevant to resistive magnets) or conductor length (relevant to superconducting magnets). The scaling law shows that decreasing the length of a cylindrical magnet beyond a certain threshold dramatically increases the cost of the magnet. The law also shows that magnets longer than the threshold do not provide significat benefits in terms of FOV size or cost. Therefore, the best designs for cylindrical magnets lie exactly on the cost threshold. The scaling law applies to all cylindrical magnet designs; cylindrical magnets are fundamentally limited in their ability to provide short magents at reasonable cost. Before the development of the present invention magnet designers were unaware of any such boundary or fundamental scaling law for cylindrical magnets.

The present invention provides magnet designs which avoid the limitations of cylindrical magnets by including coils of different diameters. The magnets of the present invention provide short length magnets with relatively large FOV at reasonable cost. The magnets of the present invention provide features only present in much more expensive cylindrical magent designs. Surprisingly, the benefits of the present magnets are the result of including coils of reduced diameter on one side of the magnet. It is quite unobvious to expect dramatic length reductions and cost reductions by adding reduced diameter coils on one side of the magent.

Figure 1:
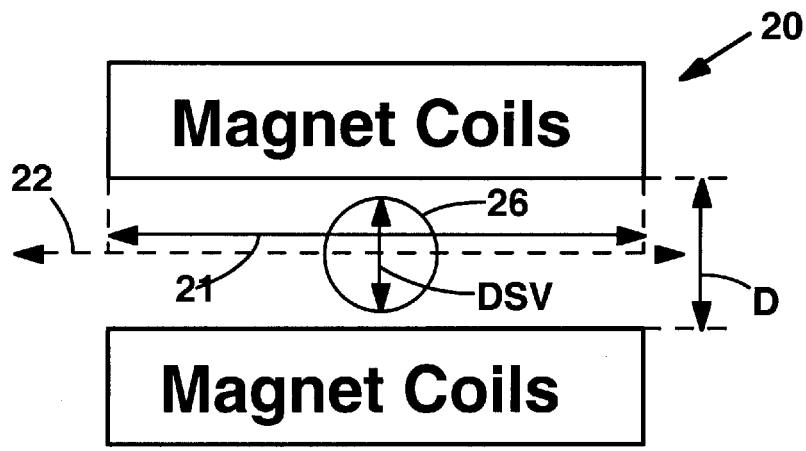
FIG. 1 (Prior Art) shows a conventional cylindrical magnet and definitions of magnet dimensions.

FIG. 1 (Prior Art) illustrates cylindrical magnet dimensions as defined within the present specification. A conventional cylindrical magnet 20 has a magnet length 21, a bore axis 22 a bore diameter D, and a field of view (FOV) 26. The FOV has a certain diameter spherical field of view DSV.

Figure 2:
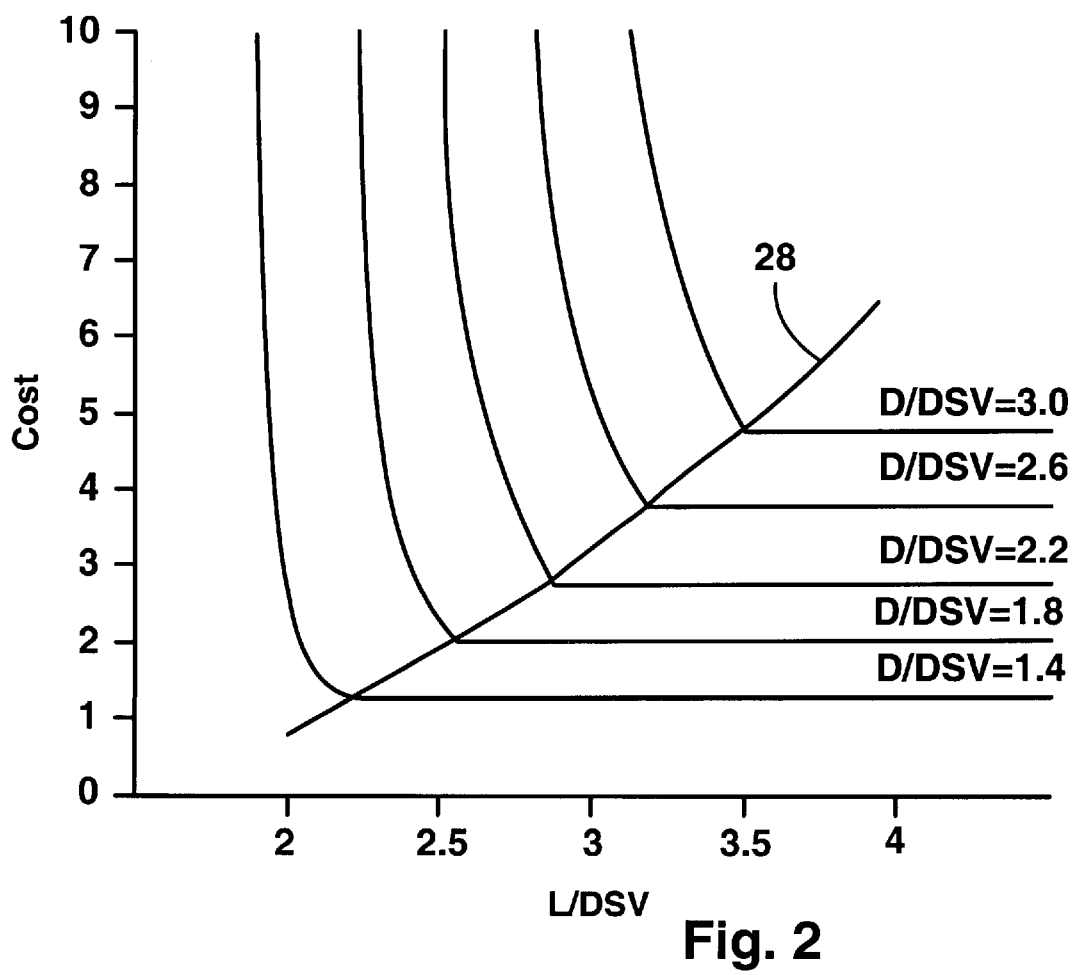
FIG. 2 shows a plot of magnet cost versus relative magnet length for several different bore diameter sizes.

FIG. 2 shows plots of cylindrical magnet cost in arbitrary units versus the magnet ratio L/DSV. The different plots correspond to different bore diameters expressed as a ratio D/DSV. These plots were discovered by the present inventors by designing thousands of magnets. The plots show that for a given ratio D/DSV there is a shortest magnet length magnet which does not have excessive cost. Magnet designs falling on curve 28 (the cost threshold) have the shortest length for a given cost. The present inventors have found that curve 28 can be described by a parametric relation:

$$L=1.2(DSV)+0.77(D).$$

Magnet designs to the left of curve 28 are quite expensive. As the length of a cylindrical magnet is shortened in the region to the left of curve 28, magnet cost increases faster than exponentially. However, as noted above, it is desirable for MRI homogeneous field magnets to be as short as possible. Therefore, most cylindrical magnets presently used in MRI applications have designs that fall on or near curve 28. For a typical full-body MRI magnet with a bore diameter of about 100 centimeters, and a FOV diameter of 40 cm, the magnet length must be at least 150 cm in order to avoid the high cost area of FIG. 2 (i.e. the area to the left side of curve 28). This is a problem because such long magnet lengths generally preclude visual access to the patient and impact patient comfort.

Figure 3:
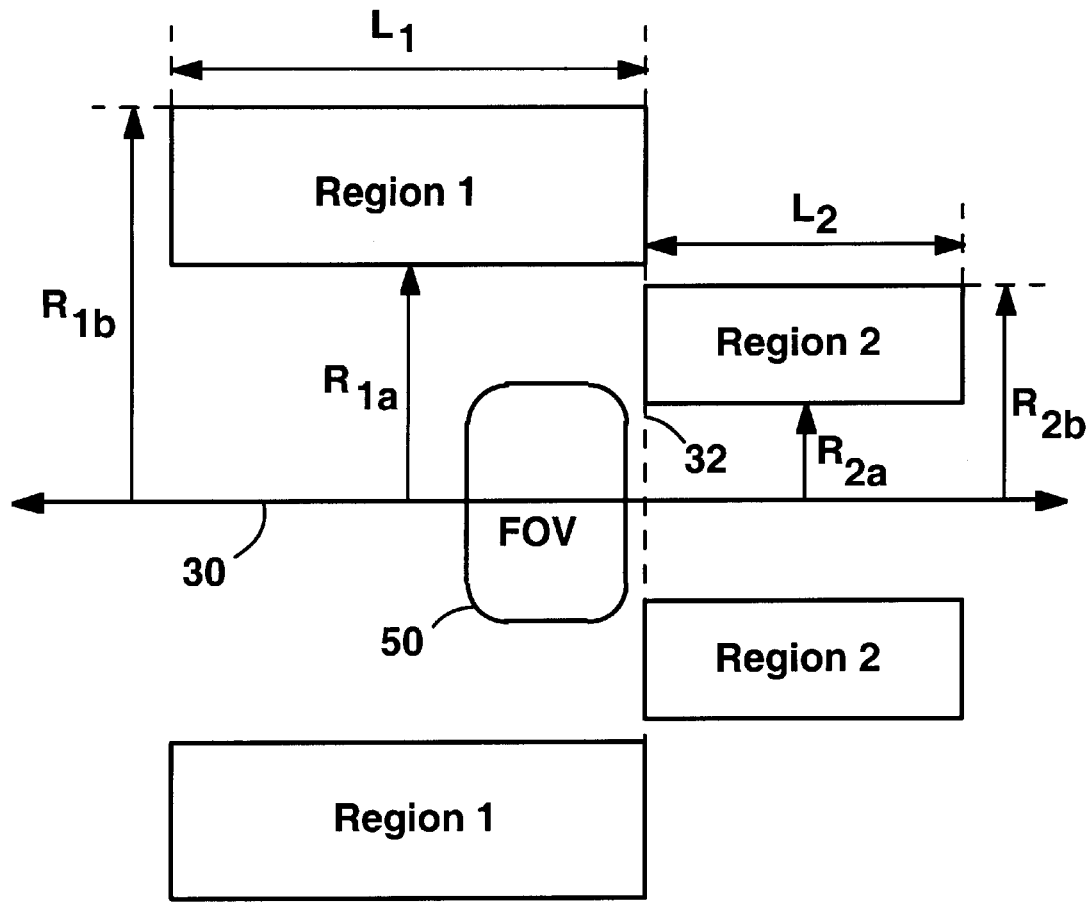
FIG. 3 is a cross sectional view illustrating the design parameters of electromagnets according to the present invention.

The present inventors have discovered that exceptionally low cost and exceptionally short magnet length are provided in magnets having one side with reduced bore diameter. The asymmetric designs created by the present inventors generally have length an FOV dimensions which are superior to optimal cylindrical designs near curve 28. FIG. 3 shows a cross sectional view illustrating magnet designs according to the present invention.

In magnets according to the present invention, at least two coils are located in region 1, and at least two coils are located in region 2. Coils in regions 1 and 2 are circular and centered about axis 30. Region 1 and region 2 are each hollow cylinders. Region 1 has an outer radius R1b, and an inner radius R1a. The outer radius R1b is in the range of 60–80 cm, more preferably in the range of 65–75 cm. The inner radius R1a is in the range of 45–60 cm, more preferably in the range of 50–55 cm. Similarly, region 2 has an outer radius R2b and an inner radius R2a. The outer radius R2b is in the range of 45–60 cm, more preferably in the range of 50–55 cm. The inner radius R2a is in the range of 22.5–45 cm, more preferably in the range of 30–38 cm. It is important to note that the outer radius R2b of region 2 is necessarily shorter than the inner radius R1a of region 1.

Region 1 and region 2 abut at midplane 32. The midplane 32 separates region 1 and region 2. Region 1 has a length L1 and region 2 has a length L2 as measured from the midplane 32. Length L1 has a length in the range of 40–100 cm, more preferably in the range of 50–70 cm. Length L2 has a length in the range of 20–40 cm, more preferably in the range of 25–35 cm. Preferably, the magnets of the present invention have a total magnet length L=L1+L2 in the range of 90–115 centimeters. The total magnet length L1+L2 is defined as the center-to-center distance between coils on opposite ends of the magnet.

Figure 4:
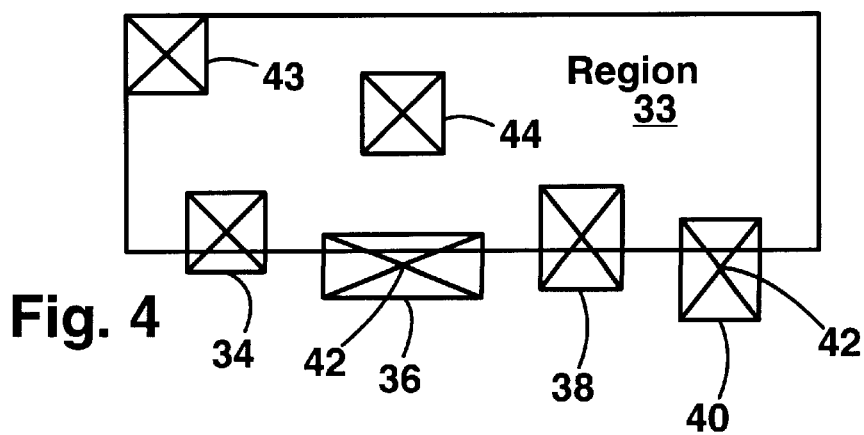
FIG. 4 illustrates a definition used in the specification of characteristic length of a nonspherical FOV.

The electromagnets of the present invention have at least two coils contained within region 1 and at least two coils contained within region 2. Each region can also have more than two coils. A coil may be considered contained within a particular region if the center of the coil is located within the region. FIG. 4 illustrates this point. Shown is ½ of an arbitrary region 33 (e.g. region 1 or region 2) and coils 34, 36, 38, 40. Coils 34 and 38 are located within region 33. Coils 36 and 40 are not located within region 33. Coils 36, 40 are not located within region 33 because the centers 42 of coils 36, 40 are not within region 33. A coil is considered entirely located within a region only if every portion of the coil is located with region. Coils 43, 44, for example, are entirely located within region 33. Preferably, the magnets of the present invention have coils entirely located within regions 1 and 2.

Figure 5:
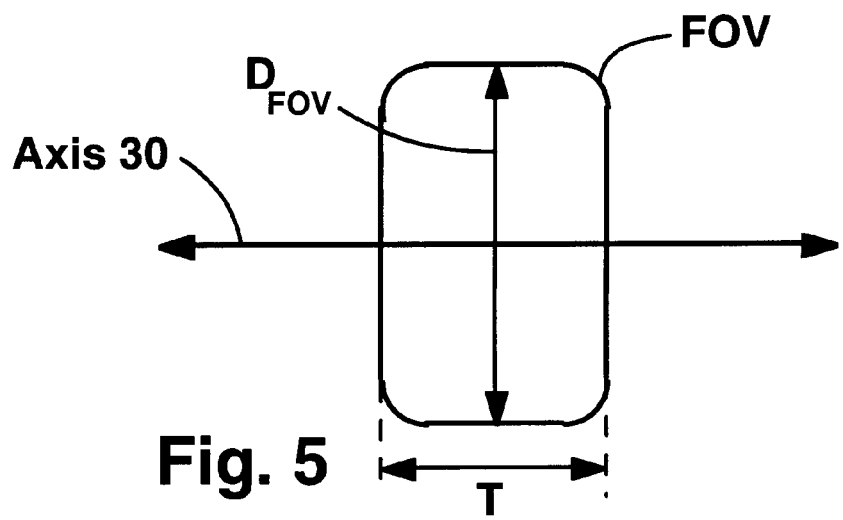
FIG. 5 illustrates the definitions of 'contained within the region' according to the present invention.

As illustrated in FIG. 3, magnets of the present invention generally have a field of view (FOV) 50 with a cylindrical shape (the field of view can also have any arbitrary shape). FIG. 5 shows a side view of a cylindrical FOV (i.e. the FOV is rotationally symmetric around axis 30). The FOV 50 has a thickness T (in an axial direction) and a diameter $D_{FOV}$ (in a radial direction). In the present specification, the FOV is defined as the volume of space which has a magnetic field homogeneous to within 10 parts-per-million, more preferably 1 ppm. This definition is generally accepted in the art.

The present inventors have discovered a cost scaling law applicable to magnets having reduced radius coils on one end. The best magnets with two different inner radii R1a and R2a have designs generally given by:

$$L_{optimum} \approx T + 0.3 D_{FOV} + 0.77(R1a+R2a)$$

Magnets satisfying this relationship have exceptionally short lengths and reasonable cost for the FOV size. Magnet cost increases extremely fast as magnet length is made shorter than $L_{optimum}$. Magnet lengths significantly longer (e.g. 10% longer) than $L_{optimum}$ do not provide significantly reduced cost or a larger FOV. Preferably, magnets of the present invention have a total magnet length within 5% of $L_{optimum}$.

Figure 6A:
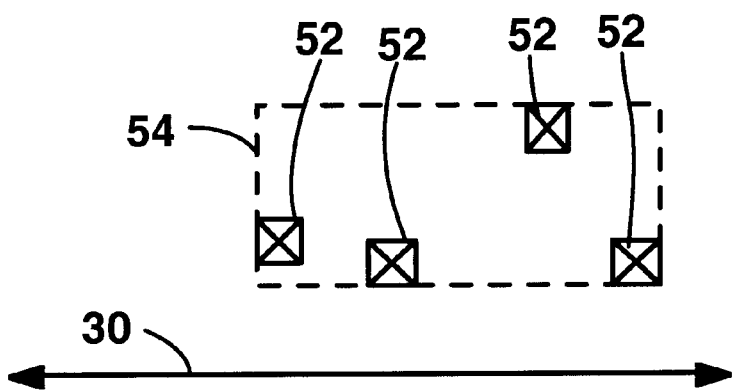
FIGS. 6A–6B illustrate how the sizes of regions 1 and 2 depend upon the locations of magnet coils.
Figure 6B:
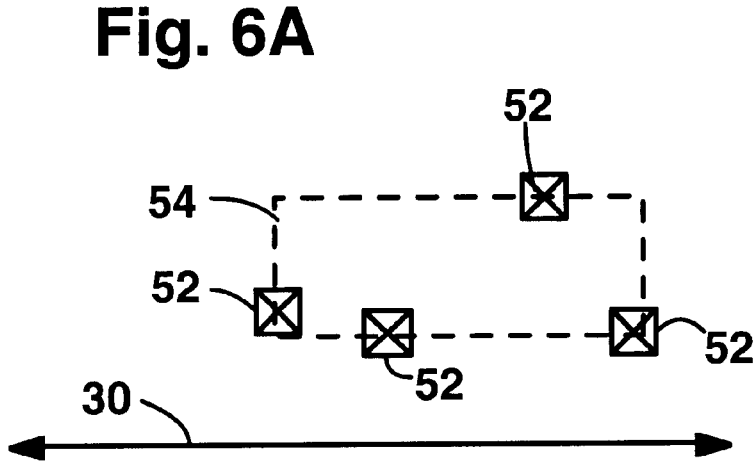

In determining R1a and R2a from inspecting a magnet, region 1 and region 2 should be considered to be as small as possible while still containing the centers of the magnet coils, or optionally, the entirety of the magnet coils. In FIG. 6A, coils 52 are entirely contained within region 54. Region 54 is the smallest region which entirely contains coils 52. In FIG. 6B, centers of coils 52 are contained within region 56. Coils 52 are not entirely contained within region 56. Region 56 is the smallest region which contains the centers of coils 52. Either of these definitions for containment can be used in appraising the scope of the present invention. However, it is preferable to use the definition based on containing the centers of the magnet coils within regions 1 and 2.

The coils in the regions 1 and 2 are designed (sized and located) so that a homogeneous magnetic field is provided within the field of view (FOV) 50. Several methods are known for designing homogeneous field magnets with coils confined to regions 1 and 2. A particularly preferred method is described in copending U.S. patent application Ser. No. 09/046,946 by the present inventors filed on Mar. 23, 1998, and herein incorporated by reference. Other methods for designing electromagnets of the present invention are described in the following references:

1) A. K. Kalafala. *A Design Approach for Actively Shielded MRI Magnets.* IEEE Trans. Mag., 26:181, 1990.

2) H. Siebold, H. Huebner, L. Soelsner, and Th. Reichert. *Performance and Results of a Computer Program for Optimizing Magnets with Iron.* IEEE Trans. Mag., 24:419, 1988

3) Sergio Pissanetzky. *Structured Coils for NMR Applications.* IEEE Trans. Mag., 28:1961, 1992.

4) M. Kitamura, S. Kakukawa, K. Mori, and T. Tominaka. *An Optimal Design Techniaue for Coil Configurations in Iron-shielding MRI Magenets.* IEEE Trans Mag., 30:2352, 1994

5) U.S. Pat. No. 5,382,904 to Pissanetzky.

Magnets of the present invention may include ferromagnetic yokes.

The electromagnets of the present invention are, of course, asymmetrical. One side of the magnet has coils with a reduced radius compared to the other side. This provides the unobvious benefit of allowing reduced length and cost for a given field of view size (compared to conventional cylindrical magnets described with reference to FIG. 2). By making coils on one side of the magnet with a reduced radius, the magnet length can be reduced without increasing the cost of the magnet.

Figure 7:
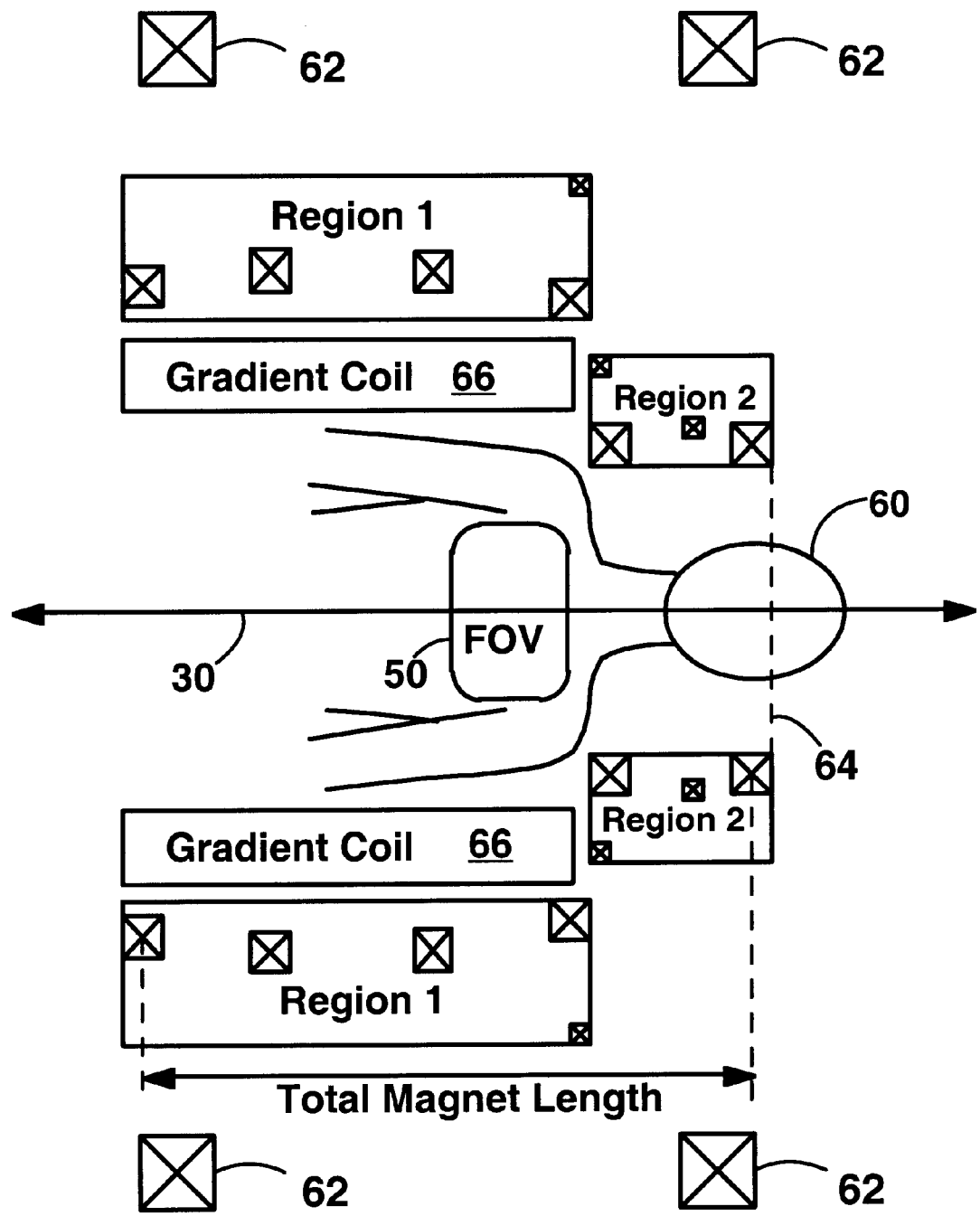
FIG. 7 shows a preferred magnet arrangement for cardiac MRI.

FIG. 7 shows a preferred embodiment of the present invention used for cardiac MRI imaging, where visual patient access is important. A patient 60 is located within the magnet so that the FOV 50 is located around the patient's heart (not shown). Region 2 is located around the patient's head. Due to the smaller radius of the coils within region 2, the FOV 50 is located relatively close to the right side 64 of the magnet. This allows the patient's head to extend from the magnet bore, thereby allowing visual access to the patient's face. Preferably, the patient's eyes extend beyond side 64. Preferably, the center of the FOV 50 is less than 40 cm from the side 64. Gradient coils 66 are located aligned (in an axial direction) with region 1. The gradient coils preferably do not reduce the bore diameter smaller than the inner radius R2a of the region 2. The location shown for the gradient coils 66 is particularly convenient.

FIG. 7 also illustrates the definition of total magnet length used in the present specification. The total magnet length is always defined as a center-to-center distance from coils on opposite ends of the magnet. This is the definition of total magnet length even if region 1 and region 2 are defined as containing the entire magnet coils (as in FIG. 7).

The magnets of the present invention may include shielding coils. Shielding coils are commonly used in MRI magnets. The embodiment of FIG. 7 has shielding coils 62. The shielding coils are located far from the region 1 and region 2. Preferably, the shielding coils have a radius of at least 70 centimeters (measured from the axis 30 to the center of the coils 62). The shielding coils are designed so that the magnetic field far from the magnet is reduced. Typically, MRI magnets are shielded so that the magnetic field 4 meters from the FOV is less than 5 Gauss. The current in the shielding coils must flow in a direction so that the field from the shielding coils opposes the field from the coils within the regions 1 and 2. The magnetic field from the shielding coils must not reinforce the magnetic field in the FOV.

The electromagnets of the present invention are particularly well suited for use in cardiac MRI. The present magnets provide a field of view that is close to one end of the magnet. This allows visual access to the patient's face while the patients heart is within the FOV.

All dimensions given in the present specification relate to the coils only and do not include measurements based on other parts such as cryostats and magnet structural components.

It will be clear to one skilled in the art that the above embodiment may be altered in many ways without departing from the scope of the invention. Accordingly, the scope of the invention should be determined by the following claims and their legal equivalents.

What is claimed is:

1. An electromagnet for providing a homogeneous magnetic field in a field of view, comprising:
    a) at least two circular coils having centers contained within a first hollow cylindrical region disposed coaxial with an axis, wherein the first region has an inner radius R1a in the range of 45–60 centimeters, an outer radius R1b in the range of 60–80 centimeters, and a length L1 in the range of 40–100 centimeters;
    b) at least two circular coils having centers contained within a second cylindrical region disposed coaxial with the axis, wherein the second region has an inner radius R2a in the range of 22.5–42 centimeters, an outer radius R2b in the range of 45–60 centimeters, and a length L2 in the range of 20–40 centimeters;
    wherein the outer radius R2b of the second region is shorter than the inner radius R1a of the first region; and
    wherein there are no coils outside the first region and the second region that reinforce a magnetic field in the field of view.

2. The electromagnet of claim 1 wherein the coils are entirely contained within the first region and within the second region.

3. The electromagnet of claim 1 wherein a total magnet length is within 5% of the quantity:

$$T+0.3D_{FOV}+0.77(R1a+R2a),$$

where T is a thickness of the field of view in an axial direction, and $D_{FOV}$ is a diameter of the field of view in a radial direction.

4. The electromagnet of claim 1 wherein a total magnet length is within 10% of the quantity:

$$T+0.3D_{FOV}+0.77(R1a+R2a),$$

where T is a thickness of the field of view in an axial direction, and $D_{FOV}$ is a diameter of the field of view in a radial direction.

5. The electromagnet of claim 1 wherein the first region and the second region abut at a midplane perpendicular to the axis.

6. The electromagnet of claim 1 wherein the inner radius R1a is in the range of 50–55 cm.

7. The electromagnet of claim 1 wherein the outer radius R1b is in the range of 65–75 cm.

8. The electromagnet of claim 1 wherein the inner radius R2a is in the range of 30–38 cm.

9. The electromagnet of claim 1 wherein the outer radius R2b is in the range of 50–55 cm.

10. The electromagnet of claim 1 wherein the length L1 of the first region is in the range of 50–70 cm.

11. The electromagnet of claim 1 wherein the length L2 of the second region is in the range of 25–35 cm.

12. The electromagnet of claim 1 wherein all the coils of the electromagnet are located within region 1 or region 2.

13. The electromagnet of claim 1 wherein the coils in the first region and the second region conduct current in the same direction.

14. The electromagnet of claim 1 wherein a single coil in the second region conducts current in a reverse direction.

15. The electromagnet of claim 1 further comprising a gradient coil for magnetic resonance imaging aligned with the first region in an axial direction, and having a radius greater than inner radius R2a.

16. The electromagnet of claim 15 wherien the gradient coil has a length less than L1.

17. The electromagnet of claim 1 wherein a total magnet length is in the range of 80–115 centimeters.

18. The electromagnet of claim 1 further comprising a shielding coil having a radius greater than outer radius R1b and opposing the magnetic field produced by the coils located within the first region an second region.

19. The electromagnet of claim 1 further comprising a third coil located within the first region.

20. The electromagnet of claim 1 further comprising a third coil located within the second region.

21. The electromagnet of claim 1 wherein center of field of view is less than 40 centimeters from an end of the magnet.

22. The electromagnet of claim 1 wherein inner radius R1a is at least 5 cm longer than outer radius R2b.

23. The electromagnet of claim 1 wherein inner radius R1a is at least 10 cm longer than outer radius R2b.

* * * * *